United States Patent
Kondo (10) Patent No.: US 9,197,218 B2
(45) Date of Patent: Nov. 24, 2015

(54) ELECTRONIC DEVICE, ELECTRONIC APPARATUS, MOVING OBJECT, AND METHOD FOR MANUFACTURING ELECTRONIC DEVICE

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/220,545

(22) Filed: Mar. 20, 2014

(65) Prior Publication Data

US 2014/0292421 A1  Oct. 2, 2014

(30) Foreign Application Priority Data

Mar. 29, 2013  (JP) ................... 2013-071611

(51) Int. Cl.
*H03H 9/05* (2006.01)
*H03L 1/02* (2006.01)
*H03L 1/04* (2006.01)

(52) U.S. Cl.
CPC ............ *H03L 1/028* (2013.01); *H03H 9/0552* (2013.01); *H03L 1/04* (2013.01); *Y10T 29/49169* (2015.01)

(58) Field of Classification Search
CPC ........................ H03H 9/0552; H03H 9/1021
USPC ................. 331/68, 158, 70; 361/774
See application file for complete search history.

(56) References Cited

U.S. PATENT DOCUMENTS

| | | | |
|---|---|---|---|
| 7,023,291 B2 * | 4/2006 | Kato et al. | 331/158 |
| 8,022,777 B2 * | 9/2011 | Stolpman et al. | 331/70 |
| 2006/0290239 A1 | 12/2006 | Kasahara et al. | |
| 2009/0256641 A1 * | 10/2009 | Lee et al. | 331/66 |

FOREIGN PATENT DOCUMENTS

| | | |
|---|---|---|
| JP | A-5-13645 | 1/1993 |
| JP | A-7-161903 | 6/1995 |
| JP | A-8-130282 | 5/1996 |
| JP | A-9-116080 | 5/1997 |
| JP | A-2000-31200 | 1/2000 |
| JP | A-2007-6270 | 1/2007 |
| JP | A-2010-199678 | 9/2010 |

* cited by examiner

*Primary Examiner* — Joseph Chang
(74) *Attorney, Agent, or Firm* — Oliff PLC (57) ABSTRACT

An electronic device includes: a support member including a first terminal, a second terminal, and a support portion extending from the first terminal and coupling the first terminal with the second terminal; an electronic component; and a bonding member connecting the first terminal with the electronic component. In a plan view along a direction in which the first terminal and the electronic component overlap each other, a portion of the first terminal is adjacent to the support portion with a notch portion therebetween and protrudes toward the extending direction side of the support portion. The support portion is bent at a portion adjacent to the protruding portion of the first terminal along the overlapping direction.

12 Claims, 11 Drawing Sheets

ELECTRONIC DEVICE, ELECTRONIC APPARATUS, MOVING OBJECT, AND METHOD FOR MANUFACTURING ELECTRONIC DEVICE

BACKGROUND

1. Technical Field

The present invention relates to an electronic device, an electronic apparatus and a moving object in both of which an electronic device is mounted, and a method for manufacturing an electronic device.

2. Related Art

Heretofore, as electronic apparatuses are downsized and thinned, further downsizing and thinning are required for electronic devices mounted in the electronic apparatuses. Especially an electronic device, such as an oven controlled crystal oscillator (OCXO) having a structure in which the ambient temperature of a quartz crystal resonator is kept constant by heating with a heating element to avoid the influence of the ambient temperature for obtaining high frequency-stability, has a structure in which the heating element and the quartz crystal resonator are supported in a state of floating above a board using a support member to prevent an increase in power consumption due to the heat of the heating element conducting to the board and dissipating to the outside of the OCXO. Therefore, there is a problem that it is very difficult to achieve the downsizing and thinning of the electronic device.

To solve the problem, JP-A-2007-6270 discloses a method for achieving downsizing and thinning in which a recess is disposed in a board and a quartz crystal resonator to which a heating element is connected is arranged in the recess and supported in a state of floating above the board by means of a support member such as an adhesive or a lead terminal.

However, when the board and the heating element disposed in the surface of the quartz crystal resonator are electrically connected by means of a lead frame, it is necessary for the OCXO to widen the board for connecting the lead terminal. Therefore, there is a problem that the downsizing is difficult.

SUMMARY

An advantage of some aspects of the invention is to solve at least a part of the problems described above, and the invention can be implemented as the following forms or application examples.

APPLICATION EXAMPLE 1

This application example is directed to an electronic device including: a support member including a first terminal, a second terminal, and a support portion extending from the first terminal and coupling the first terminal with the second terminal; an electronic component; and a bonding member connecting the first terminal with the electronic component, wherein in a plan view along a direction in which the first terminal and the electronic component overlap each other, a portion of the first terminal is adjacent to the support portion with a notch portion therebetween and protrudes toward the extending direction side of the support portion, and the support portion is bent at a portion adjacent to the protruding portion of the first terminal along the overlapping direction.

According to this application example, the support member has a structure in which the support member is bent at the notch portion of the first terminal located inside the outer edge of the electronic component in the direction apart from the electronic component. Therefore, it is possible to narrow a gap between the second terminals of the support members facing each other for achieving the connection with the board, so that there is an advantageous effect that the downsizing of the electronic device can be achieved.

APPLICATION EXAMPLE 2

This application example is directed to the electronic device according to the application example described above, wherein the electronic component includes a third terminal, and the bonding member includes a conductive first bonding member connecting the first terminal with the third terminal and a non-conductive second bonding member connecting, together with the first bonding member, the first terminal with the electronic component.

According to this application example, the first terminal of the support member and the third terminal disposed on the electronic component are connected by means of the conductive first bonding member, so that the support member and the electronic component can be electrically connected. The support member and the electronic component are mechanically connected by means of the non-conductive second bonding member around the third terminal connected with the first terminal, so that shorts between the third terminal and adjacent terminals are avoided. Therefore, there is an advantageous effect that the mechanical bonding strength can be increased in a state of maintaining the electrical connection between the support member and the electronic component.

APPLICATION EXAMPLE 3

This application example is directed to the electronic device according to the application example described above, wherein the first terminal includes a first region overlapping the third terminal and a second region located outside the third terminal in the plan view, the first bonding member connects the first region with the third terminal, and the second bonding member connects the second region with the electronic component.

According to this application example, the support member and the electronic component are connected by means of the conductive first bonding member at the region where the first terminal of the support member and the third terminal disposed on the electronic component overlap each other, so that the support member and the electronic component can be electrically connected. The support member and the electronic component are connected by means of the non-conductive second bonding member around the region overlapping the third terminal of the electronic component, so that the connecting area can be increased. Therefore, the mechanical bonding strength between the support member and the electronic component can be more increased. Further, for example, when the first bonding member such as solder is used, there is an advantageous effect that it is possible to prevent solder from melting and flowing due to heating in mounting to a board or connecting to a cover.

APPLICATION EXAMPLE 4

This application example is directed to the electronic device according to the application example described above, wherein the second region of the first terminal includes a region located outside the electronic component in the plan view.

According to this application example, the second region of the first terminal of the support member is the region located outside the electronic component, so that the area of connecting the support member with the electronic component by means of the non-conductive second bonding member can be more increased and a side surface portion of the electronic component can also be connected. Therefore, there is an advantageous effect that the mechanical bonding strength between the support member and the electronic component can be more increased.

APPLICATION EXAMPLE 5

This application example is directed to the electronic device according to the application example described above, wherein the first terminal includes a plurality of the notch portions.

According to this application example, by disposing the plurality of notch portions in the first terminal, the support member can be bent inside the outer edge of the electronic component in a state of connecting with the first terminal. Therefore, the mounting area of the support member connected with the electronic component can be reduced, so that there is an advantageous effect that the downsizing of the electronic device is achieved. Moreover, since the area of connecting the first terminal with the electronic component can be increased, there is an advantageous effect that the mechanical bonding strength between the support member and the electronic component can be more increased.

APPLICATION EXAMPLE 6

This application example is directed to the electronic device according to the application example described above, wherein the electronic device further includes a board, and the electronic component is supported in a spaced-apart state to the board via the support member.

According to this application example, the electronic component is supported to the board in the spaced-apart state, so that the electronic component can be brought into a state of floating above the board. Therefore, for example, heat is unlikely to be conducted between the electronic component and the board, and the influence of a change in ambient temperature can be reduced, so that there is an advantageous effect that the electronic device having stable characteristics is obtained.

APPLICATION EXAMPLE 7

This application example is directed to an electronic apparatus including the electronic device according to the application example described above.

According to this application example, there is an advantageous effect that the electronic apparatus including the electronic device that is small in size and excellent in mechanical strength is obtained.

APPLICATION EXAMPLE 8

This application example is directed to a moving object including the electronic device according to the application example described above.

According to this application example, there is an advantageous effect that the moving object including the electronic device that is small in size and excellent in mechanical strength can be configured.

APPLICATION EXAMPLE 9

This application example is directed to a method for manufacturing an electronic device including a support member including a first terminal, a second terminal, and a support portion extending from the first terminal and coupling the first terminal with the second terminal, an electronic component, and a bonding member connecting the first terminal with the electronic component, wherein in a plan view along a direction in which the first terminal and the electronic component overlap each other, a portion of the first terminal is adjacent to the support portion with a notch portion therebetween and protrudes toward the extending direction side of the support portion, and the support portion is bent at a portion adjacent to the protruding portion of the first terminal along the overlapping direction. The method includes: connecting the first terminal with the electronic component by means of a first bonding member and connecting the first terminal with the electronic component by means of a second bonding member; and bending the support portion at a portion adjacent to the protruding portion of the first terminal along the overlapping direction.

According to this application example, the support member is bent at the portion of the first terminal where the notch portion is disposed in the direction apart from the electronic component, so that the support member can be bent inside the outer edge of the electronic component and it is possible to narrow a gap between the second terminals of the support members facing each other for achieving the connection with the board. Therefore, there is an advantageous effect that the electronic device that is small in size can be manufactured.

APPLICATION EXAMPLE 10

This application example is directed to the method for manufacturing the electronic device according to the application example described above, the electronic component includes a third terminal, and the first terminal includes a first region overlapping the third terminal and a second region located outside the third terminal in the plan view, the second bonding member is a member that is cured by heating, and the method further includes, after putting the second bonding member between the first terminal and the electronic component from a region located outside the second region, heating and curing the second bonding member.

According to this application example, the electrical connection between the support member and the electronic component is achieved by means of, for example, the conductive first bonding member, and thereafter, for example, the non-conductive second bonding member that is thermosetting is applied from the second region of the first terminal disposed outside the electronic component, so that the thermosetting second bonding member spreads around the first bonding member by capillary action of an adhesive. Therefore, by subsequently heating and curing the second bonding member, there is an advantageous effect that it is possible to manufacture the electronic device in which the bonding strength between the support member and the electronic component can be more increased while maintaining the electrical connection between the support member and the electronic component.

BRIEF DESCRIPTION OF THE DRAWINGS

The invention will be described with reference to the accompanying drawings, wherein like numbers reference like elements.

FIGS. 1A and 1B are schematic configuration views of an electronic device according to an embodiment of the invention, in which

FIGS. 3A and 3B are schematic view explaining a difference in mounting area between the electronic device according to the embodiment of the invention and a related-art electronic device, in which

FIGS. 8A and 8B are schematic views explaining the manufacturing process of the electronic device according to the embodiment of the invention, in which

FIGS. 9A and 9D are schematic views explaining the manufacturing process of the electronic device according to the embodiment of the invention, in which

FIGS. 10A to 10D are schematic plan views showing modified examples of the lead frame terminal used for the electronic device according to the embodiment of the invention, in which FIG. 10A is a schematic plan view of Modified Example 1; FIG. 10B is a schematic plan view of Modified Example 2; FIG. 10C is a schematic plan view of Modified Example 3; and FIG. 10D is a schematic plan view of Modified Example 4.

DESCRIPTION OF EXEMPLARY EMBODIMENTS

Figure 1A:
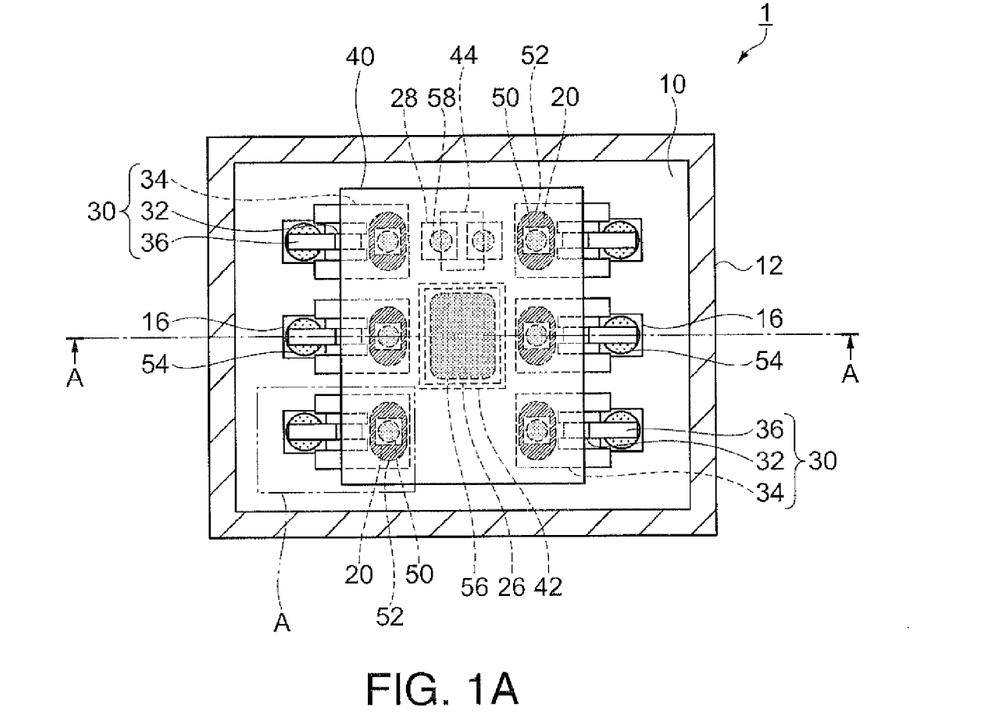
FIG. 1A is a schematic plan view showing the interior thereof.
Figure 1B:
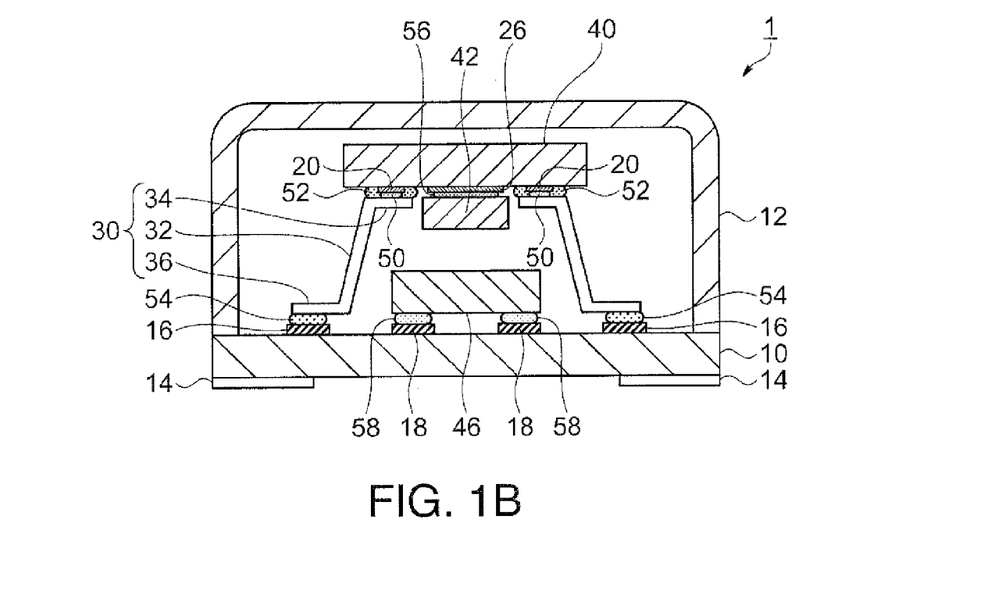
FIG. 1B is a cross-sectional view taken along the line A-A.
Figure 2:
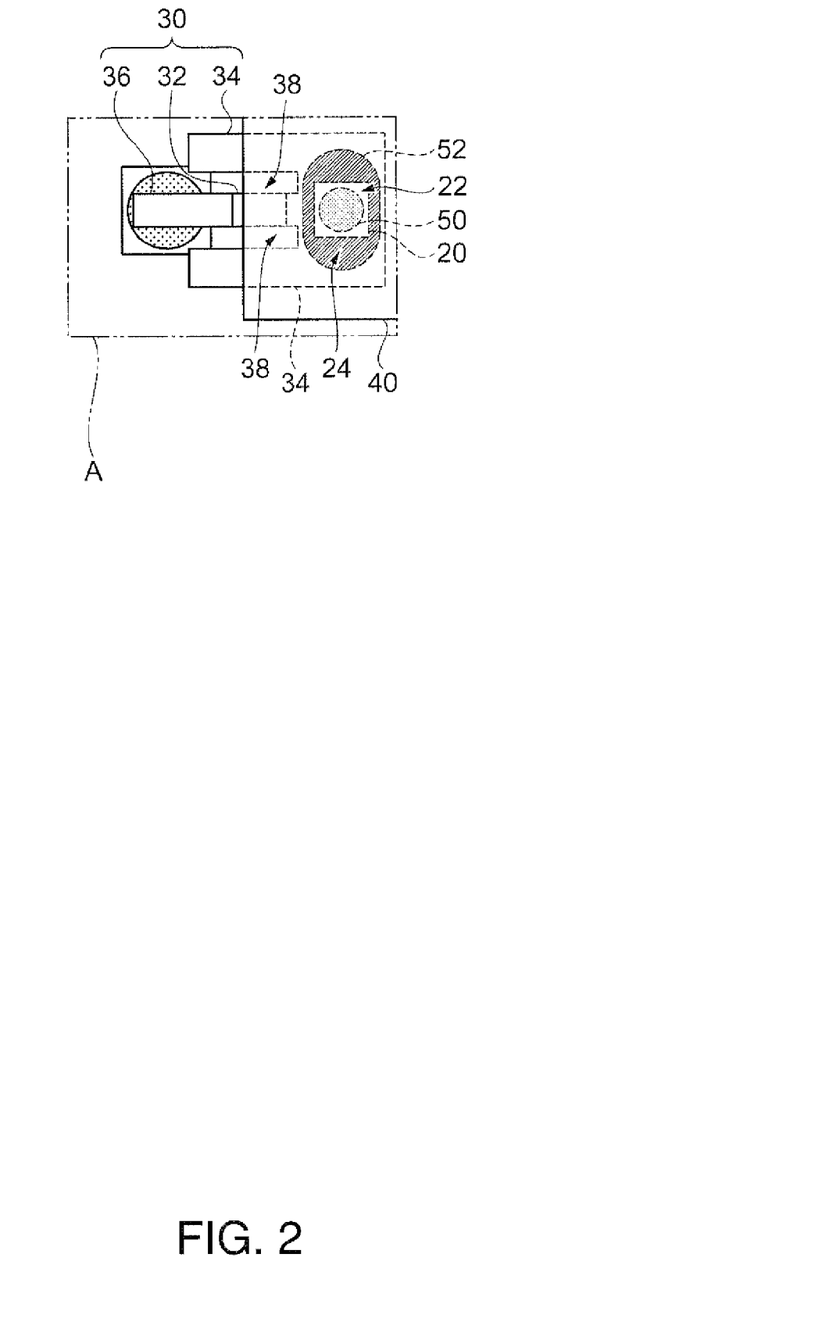
FIG. 2 is a schematic plan view of the interior of the electronic device according to the embodiment of the invention, which is an enlarged view of the portion A in FIG. 1A.
Figure 3A:
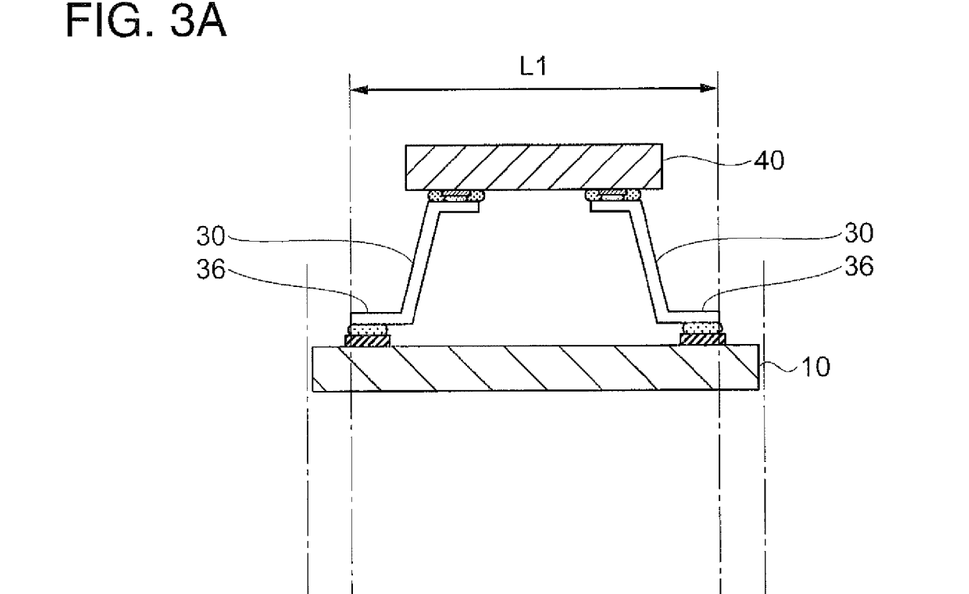
FIG. 3A is a schematic cross-sectional view of the electronic device according to the embodiment of the invention.
Figure 3B:
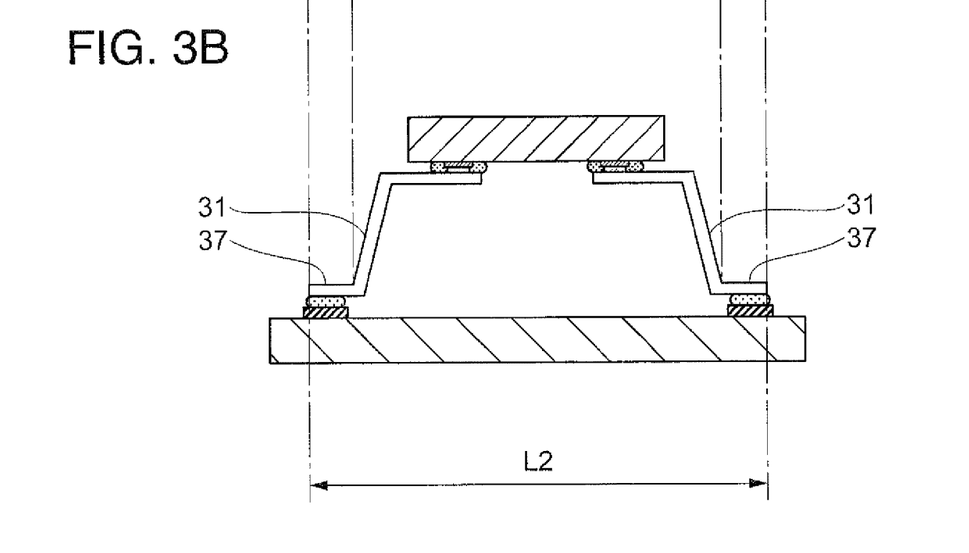
FIG. 3B is a schematic cross-sectional view of the related-art electronic device.

Hereinafter, embodiments of the invention will be described in detail based on the drawings.
Electronic Device FIGS. 1A and 1B are schematic configuration views of an electronic device according to an embodiment of the invention, in which FIG. 1A is a schematic plan view showing the interior thereof; and FIG. 1B is a cross-sectional view taken along the line A-A in FIG. 1A. FIG. 2 is a schematic plan view of the interior of the electronic device according to the embodiment of the invention, which is an enlarged view of the portion A in FIG. 1A. FIGS. 3A and 3B are schematic cross-sectional views explaining a difference in mounting area between the electronic device according to the embodiment of the invention and a related-art electronic device. FIG. 1A shows the electronic device 1 in a state where the upper portion of a cover 12 is removed, for the sake of explaining the configuration of the interior of the electronic device 1. As an electronic component constituting the electronic device 1 according to the embodiment of the invention, a resonator 40 to which a heating element 42 and a thermosensor 44 are connected will be described as an example.

The electronic device 1 shown in FIGS. 1A and 1B is configured to include a board 10 for mounting an electronic component or a support member thereon, the cover 12 that covers the electronic component or the support member mounted on the board 10, the resonator 40 as an electronic component, the heating element 42 that heats the resonator 40, the thermosensor 44 that measures the temperature of the resonator 40, lead frame terminals 30 as support members that support the resonator 40, and an IC chip 46 including an oscillator circuit that drives the resonator 40 and a temperature control circuit that controls the heating element 42.

The resonator 40 includes a vibrating element mounted in the interior of a package made of ceramic or the like. The interior of the package of the resonator 40 is hermetically sealed in a reduced-pressure atmosphere or an inert gas atmosphere such as nitrogen.

On one main surface of the resonator 40, a plurality of third terminals 20 and mounting terminals 26 and 28 for connecting the heating element 42 or the thermosensor 44 are formed.

The plurality of third terminals 20 disposed on the one main surface of the resonator 40 are connected in one-to-one correspondence with first terminals 34 of the plurality of lead frame terminals 30. As shown in FIG. 1B, the third terminal 20 is electrically connected with the first terminal 34 of the lead frame terminal 30 by means of a conductive first bonding member 50 such as a solder or metal bump. Moreover, the third terminal 20 and the first terminal 34 are connected by means of a non-conductive second bonding member 52 around the first bonding member 50. The second bonding member 52 is, for example, a resin-based adhesive having a low heat conductivity such as epoxy or silicone. In the embodiment, the shape of the third terminal 20 is rectangular. However, the shape is not limited to be rectangular but may be circular. This is because when the shape of the third terminal 20 is circular, the conductive first bonding member 50 achieving the electrical connection uniformly spreads over the third terminal 20, and therefore, there is an advantageous effect that the third terminal 20 of the resonator 40 can be stably connected with the first terminal 34 of the lead frame terminal 30.

The third terminal 20 disposed on the one main surface of the resonator 40 and the first terminal 34 of the lead frame terminal 30 are connected by means of the conductive first bonding member 50 at a first region 22 where the third terminal 20 and the first terminal 34 overlap each other as shown in FIG. 2, and therefore electrically connected to each other. Moreover, the third terminal 20 and the first terminal 34 are mechanically connected by means of the non-conductive second bonding member 52 at a second region 24 where the one main surface of the resonator 40 and the first terminal 34 overlap each other around the third terminal 20. The second region 24 may be a region extended to a region of the first terminal 34 not overlapping the one main surface of the resonator 40. This is because when the second bonding member 52 is applied to the region of the first terminal 34 not overlapping the one main surface of the resonator 40 to connect the third terminal 20 with the first terminal 34, the second bonding member 52 goes around a side surface portion of the resonator 40 to connect the third terminal 20 with the first terminal 34, and therefore, there is an advantageous effect that the bonding strength between the third terminal 20 and the first terminal 34 of the lead frame terminal 30 can be more increased.

The electronic device 1 of the embodiment has a structure in which the third terminal 20 of the resonator 40 and the first terminal 34 of the lead frame terminal 30 are connected by means of the conductive first bonding member 50 and the non-conductive second bonding member 52. Therefore, there are advantageous effects that the electrical connection can be achieved and a connection with high mechanical bonding strength can be made. Moreover, the first terminal 34 and the third terminal 20 are connected by means of the second bonding member 52 formed of a resin-based material around the first bonding member 50. Therefore, when the first bonding member 50 such as solder is used for the connection between the first terminal 34 and the third terminal 20, there is an advantageous effect that it is possible to prevent the occurrence of a short caused by a contact between other terminals and the first bonding member 50 such as solder that melts and flows by heating with a reflow apparatus for mounting the electronic device 1 on a mounting board of an electronic apparatus or the like.

The heating element 42 such as, for example, a power transistor or a heater is connected to the resonator 40 by means of a bonding member 56 having a high heat conductivity such as solder on the mounting terminal 26 disposed on the one main surface of the resonator 40. By connecting the heating element 42 using the bonding member 56 having a high heat conductivity, the heat from the heating element 42 is efficiently conducted to the resonator 40, and the power consumed by the heating element 42 is reduced. Therefore, there is an advantageous effect that the electronic device 1 with low power consumption is obtained. The mounting terminal 26 is electrically connected to a ground terminal (not shown) of the electronic device 1 through the lead frame terminal 30 with an electrode wiring (not shown) disposed on the one main surface of the resonator 40, so that the occurrence of an electrical noise is prevented.

The thermosensor 44 such as, for example, a thermistor or a quartz crystal resonator for temperature sensor is electrically connected to the resonator 40 by means of a conductive bonding member 58 such as a solder or metal bump on the mounting terminal 28 disposed on the one main surface of the resonator 40. The thermosensor 44 is electrically connected to the IC chip 46 including the temperature control circuit through the lead frame terminal 30 with an electrode wiring (not shown) disposed on the one main surface of the resonator 40.

The lead frame terminal 30 as a support member includes the first terminal 34 and a second terminal 36 at both ends of a support portion 32. Two notch portions 38 are arranged in the first terminal 34 such that the notch portions 38 are spaced apart from each other with a gap corresponding to the width of the support portion 32 on the side where the first terminal 34 is coupled with the support portion 32. Since the notch portions 38 are disposed in the first terminal 34, the first terminal 34 can be bent at the central portion thereof or at a position close to the inner side of the outer edge of the resonator 40, which is advantageous for a reduction in mounting area to the board 10. The width of the support portion 32 is smaller than the width of the first terminal 34. The reason of this is to reduce the conduction of heat of the heating element 42 to the board 10 through the support portion 32 while maintaining the bonding strength at the first terminal 34. The first terminal 34 of the lead frame terminal 30 is connected with the third terminal 20 of the resonator 40. The second terminal 36 is connected by means of a conductive third bonding member 54 to a lead electrode 16 disposed on the board 10, and therefore electrically connected to the lead electrode 16.

Figure 13:
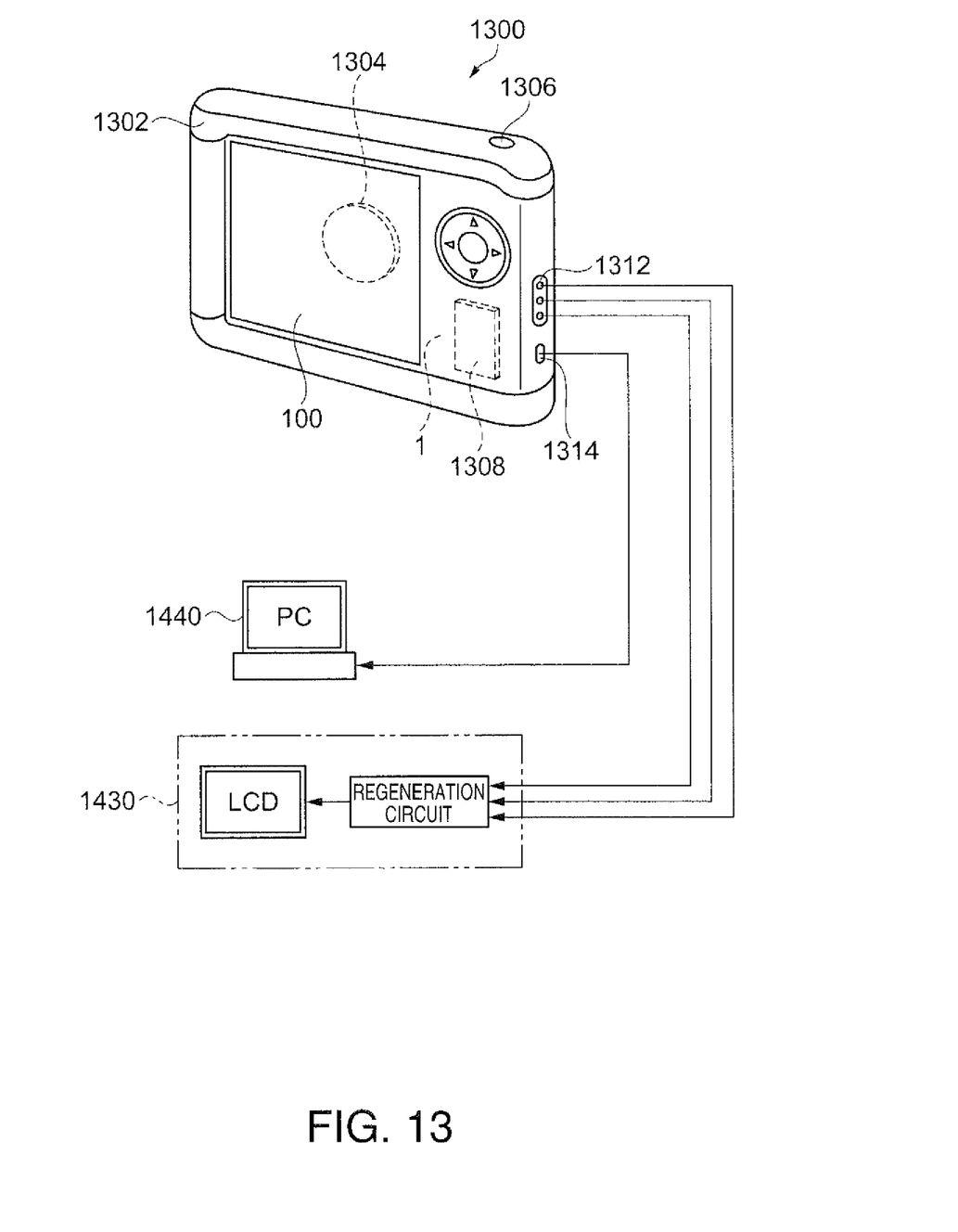
FIG. 13 is a perspective view showing the configuration of a digital camera as an electronic apparatus including the electronic device according to the invention.

As shown in FIG. 13, the first terminal 34 of the lead frame terminal 30 is bent toward the board 10 side in the vicinity where the notch portions 38 are disposed (refer to FIG. 2). Further, the support portion 32 is bent such that the second terminal 36 is substantially parallel to the board 10. Therefore, the first terminal 34 and the second terminal 36 are substantially parallel to the main surface of the resonator 40 or the board 10. Hence, by connecting the second terminals 36 to the plurality of lead electrodes 16 disposed on the board 10, the resonator 40 to which the heating element 42 and the thermosensor 44 are connected can be supported in a state of floating above the board 10. Therefore, the heat from the heating element 42 that heats the resonator 40 is less likely to be conducted to the board 10 through the lead frame terminal 30 as a support member, so that there is an advantageous effect that low power consumption of the electronic device 1 can be achieved.

The IC chip 46 including the oscillator circuit for driving the resonator 40 and the temperature control circuit that controls the heating element 42 based on temperature information from the thermosensor 44 is connected by means of conductive bonding members 38 to mounting electrodes 18 disposed on the board 10, and therefore electrically connected to the mounting electrodes 18. Since the electronic device 1 has a structure in which the resonator 40 is supported in a state of floating above the board 10, the IC chip 46 can be mounted in a space between the resonator 40 and the board 10. Therefore, the board 10 can be made small, so that the downsizing of the electronic device 1 can be achieved.

Next, the shape of the lead frame terminal 30, which enables the downsizing of the electronic device 1, will be described.

FIGS. 3A and 3B are schematic views explaining a difference in mounting area between the electronic device according to the embodiment of the invention and a related-art electronic device, in which FIG. 3A is a schematic cross-sectional view of the electronic device according to the embodiment of the invention; and FIG. 3B is a schematic cross-sectional view of the related-art electronic device.

The lead frame terminal 30 of the electronic device 1 according to the embodiment of the invention has a shape in which the lead frame terminal 30 is bent inside the outer edge of the resonator 40 toward the board 10 side as shown in FIG. 3A. Therefore, a length L1 between the tips of the second terminals 36 of two lead frame terminals 30 connected to face each other along the one main surface of the resonator 40 can be shortened compared to a length L2 between the tips of second terminals 37 of lead frame terminals 31 of the related-art electronic device shown in FIG. 3B. Hence, since the board 10 for mounting various kinds of electronic components thereon can be made small, the electronic device 1 that is small in size can be obtained.

Returning back to FIGS. 1A and 1B, the lead electrodes 16 for connecting the plurality of lead frame terminals 30 and the mounting electrodes 18 for connecting the IC chip 46 are disposed on one main surface of the board 10. The lead electrodes 16 and the mounting electrodes 18 are electrically connected by means of an electrode wiring (not shown) disposed on the one main surface of the board 10. On the other surface of the board 10, external terminals 14 for mounting the electronic device 1 on a mounting board of an electronic apparatus or the like are disposed. The external terminals 14 and the mounting electrodes 18 for connecting the IC chip 46 are electrically connected by means of an electrode wiring (not shown) disposed on the one main surface of the board 10 or a through-electrode (not shown) disposed in the interior of the board 10.

The board 10 is composed of a material such as insulating ceramics or glass epoxy. The respective electrodes and terminals disposed on the board 10, or the electrode wiring or through-electrode electrically connecting the electrodes or terminals are formed generally by a method of screen printing a metal material such as tungsten (W) or molybdenum (Mo) on the board, baking the metal material, and plating nickel (Ni), gold (Au), or the like on the baked metal material, or by a method of etching the board on the entire surface of which a copper foil is applied.

The cover 12 may be composed of the same ceramics material as that of the board 10, in addition to a metal material such as Kovar. However, a metal material has a shielding effect, which is advantageous in terms of prevention of an external electrical influence. The cover 12 is connected to the board 10 by means of solder, an adhesive, or the like so as to surround the edge portion of the board, and covers the electronic components or the like including the resonator 40 mounted on the board 10.

Manufacturing Method

A method for manufacturing the electronic device 1 according to the embodiment of the invention will be described.

Figure 4:
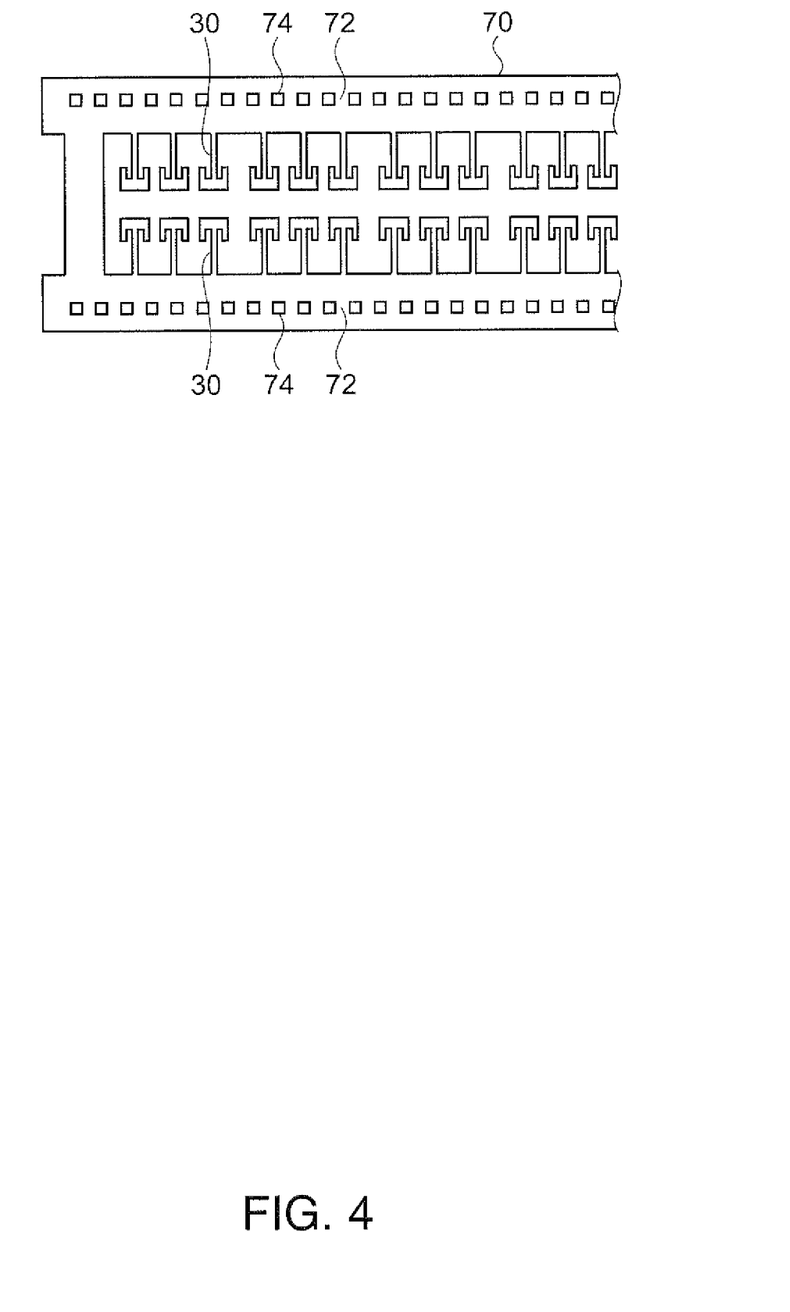
FIG. 4 is a schematic plan view of a lead frame used for the electronic device according to the embodiment of the invention.
Figure 5:
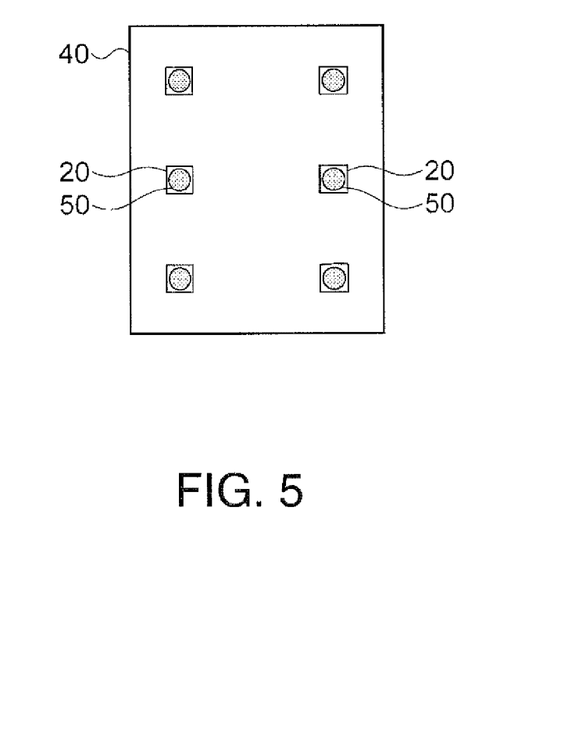
FIG. 5 is a schematic plan view explaining the manufacturing process of the electronic device according to the embodiment of the invention.
Figure 6:
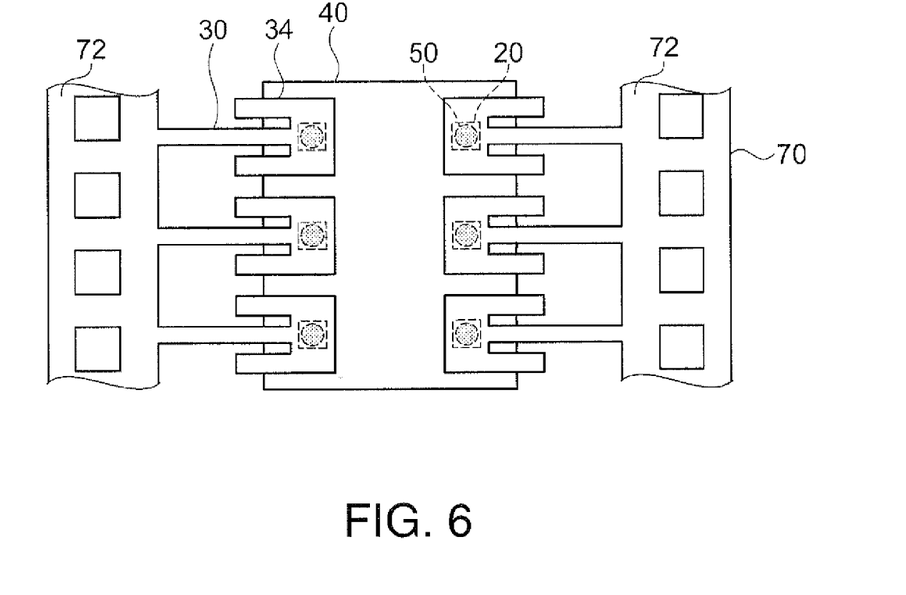
FIG. 6 is a schematic plan view explaining the manufacturing process of the electronic device according to the embodiment of the invention.
Figure 7:
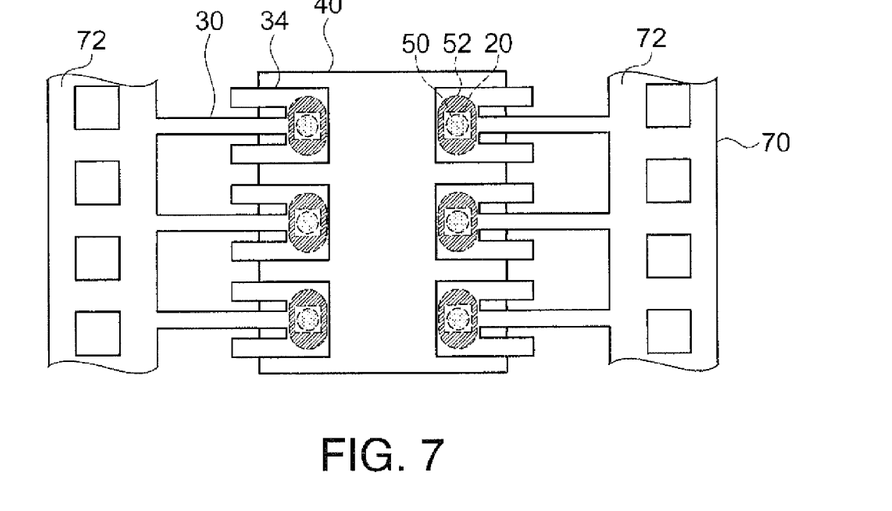
FIG. 7 is a schematic plan view explaining the manufacturing process of the electronic device according to the embodiment of the invention.
Figure 8A:
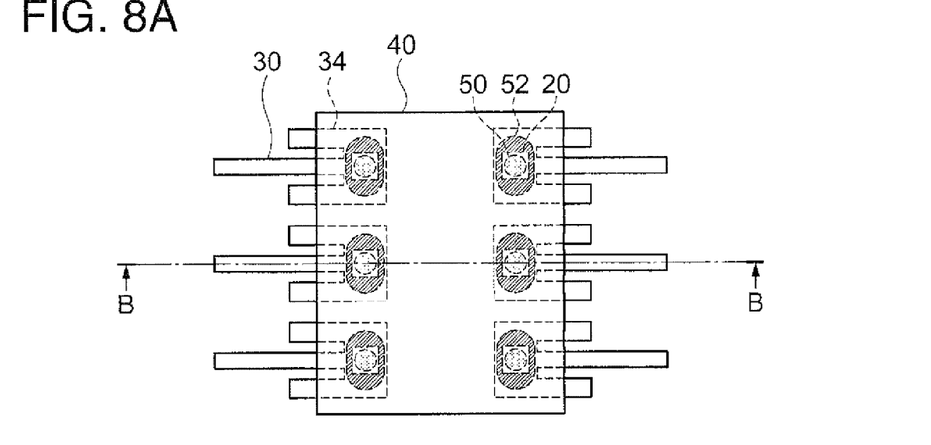
FIG. 8A is a schematic plan view.
Figure 8B:
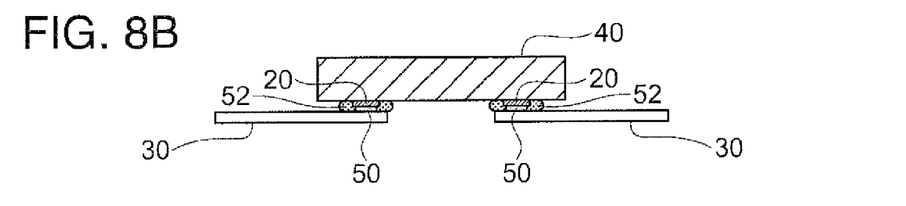
FIG. 8B is a cross-sectional view taken along the line B-B.
Figure 9A:
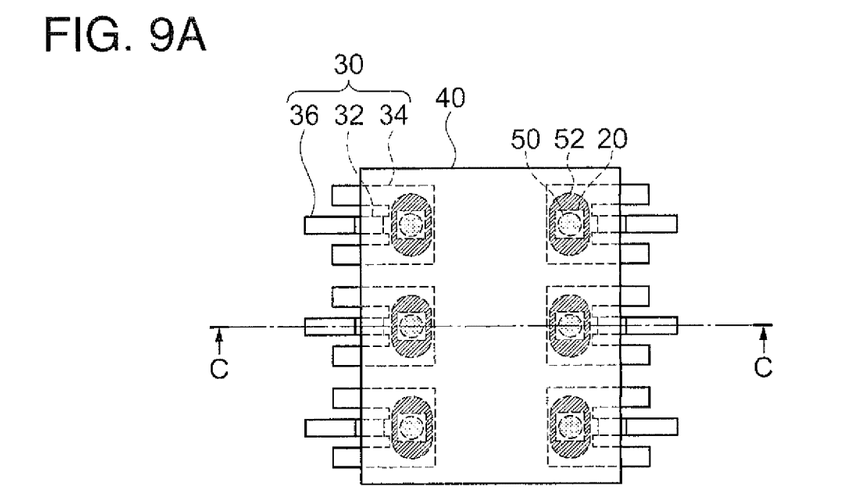
FIG. 9A is a schematic plan view.

FIG. 4 is a schematic plan view of a lead frame used for the electronic device according to the embodiment of the invention. FIGS. 5 to 9B are schematic views explaining the manufacturing process of the electronic device according to the embodiment of the invention. Specifically, FIGS. 5 to 7 are schematic plan views explaining the manufacturing process of the electronic device according to the embodiment of the invention. FIGS. 8A and 8B are schematic views explaining the manufacturing process of the electronic device according to the embodiment of the invention, in which FIG. 8A is a schematic plan view; and FIG. 8B is a cross-sectional view taken along the line B-B in FIG. 8A. FIGS. 9A and 9R are schematic views explaining the manufacturing process of the electronic device according to the embodiment of the invention, in which FIG. 9A is a schematic plan view; and FIG. 95 is a cross-sectional view taken along the line C-C in FIG. 9A.

As shown in FIG. 4, in the lead frame 70 used in manufacture, the plurality of lead frame terminals 30 are disposed to be coupled to a frame portion 72 so that a number of electronic devices 1 can be collectively manufactured. In the frame portion 72 of the lead frame 70, holes 74 are disposed. The holes 74 are necessary for automatically moving the lead frame 70 in a reflow apparatus for melting and curing the bonding members 50, 52, 54, 56, and 58. The lead frame 70 is formed by processing, by punching (press), etching, or the like, a thin plate of a Cu alloy-based material, an iron alloy-based material, or other metal materials excellent in mechanical strength, electrical conductivity, heat conductivity, corrosion resistance, or the like.

In the method for manufacturing the electronic device 1 according to the embodiment of the invention, the conductive first bonding members 50 are first formed on the third terminals 20 disposed on the one main surface of the resonator 40 as shown in FIG. 5.

Next, as shown in FIG. 6, alignment is performed such that the conductive first bonding members 50 formed on the third terminals 20 of the resonator 40 correspond to the first terminals 34 of the lead frame terminals 30 disposed to be coupled to the frame portion 72 of the lead frame 70. Thereafter, the conductive first bonding members 50 are melted and cured using a reflow apparatus or the like.

Thereafter, as shown in FIG. 7, the non-conductive second bonding member 52 composed of an adhesive such as an epoxy resin or a silicone resin is applied to the second region 24 of the first terminal 34 shown in FIG. 2. The second bonding member 52 spreads, by capillary action of the adhesive, around the first bonding member 50 that is already cured. Therefore, by subsequently heating and curing the second bonding member 52, the bonding strength between the first terminal 34 and the third terminal 20 can be more increased while maintaining the electrical connection between the first terminal 34 and the third terminal 20. Moreover, even when the second bonding member 52 is applied to the first terminal 34 located outside the resonator 40, the second bonding member 52 spreads similarly, by capillary action of the adhesive, around the first bonding member 50 that is already cured. Therefore, the bonding strength between the first terminal 34 and the third terminal 20 can be more increased.

Figure 9B:
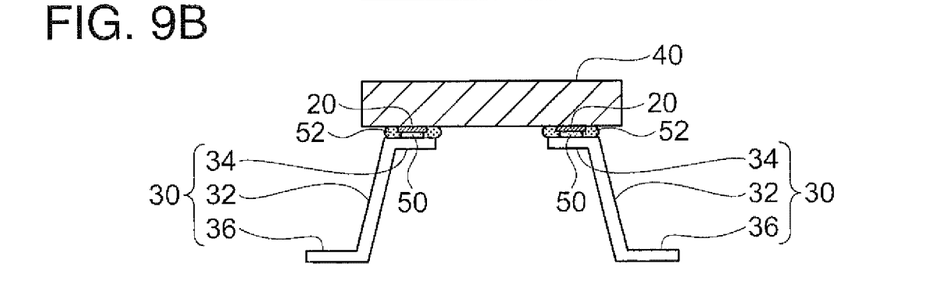
FIG. 9B is a cross-sectional view taken along the line C-C.

Next, the lead frame 70 is cut between the frame portion 72 and the lead frame terminal 30, so that the resonators 40 connected to the lead frame 70 are singulated as shown in FIGS. 8A and 8B. Thereafter, as shown in FIGS. 9A and 9B, the lead frame terminal 30 is once bent in the vicinity of the first terminal 34 toward the side apart from the resonator 40 connected with the lead frame terminal 30, and further bent such that the second terminal 36 of the lead frame terminal 30 is substantially parallel to the main surface of the resonator 40.

Thereafter, as shown in FIGS. 1A and 1B, alignment is performed such that the second terminals 36 of the plurality of lead frame terminals 30 respectively correspond to the plurality of lead electrodes 16 disposed on the board 10 on which the IC chip 46 is mounted. After connecting the second terminals 36 with the lead electrodes 16 by means of the conductive third bonding members 54, the cover 12 is connected, so that the electronic device 1 is completed. Since the lead frame terminal 30 having a twice bent shape is used, the resonator 40 can be supported in the state of floating above the board 10. Therefore, it is possible to manufacture the electronic device 1 that is small in size and in which the IC chip 46 or other electronic components are mounted under the resonator 40.

Lead Frame Terminal

Next, modified examples of the lead frame terminal 30 used for the electronic device according to the embodiment of the invention will be described.

MODIFIED EXAMPLE 1

Figure 10A:
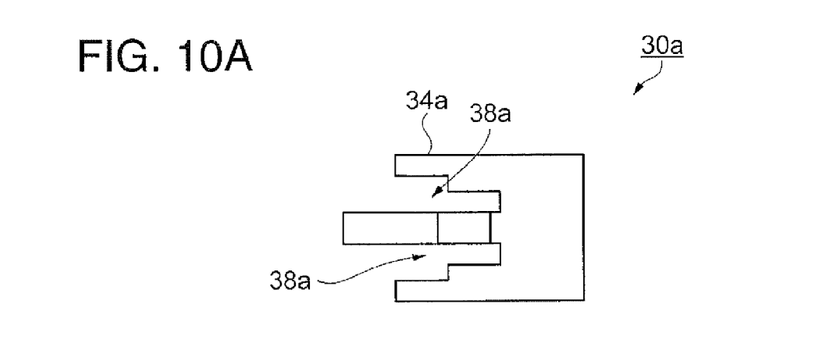

FIG. 10A is a schematic configuration view showing Modified Example 1 of the lead frame terminal used for the electronic device according to the embodiment of the invention.

Hereinafter, a lead frame terminal 30a of Modified Example 1 will be described mainly on the difference from the lead frame terminal 30 of the embodiment described above, and the description of the same matters is omitted.

As shown in FIG. 10A, the lead frame terminal 30a of Modified Example 1 differs from the lead frame terminal 30 of the embodiment in that each notch portion 38a disposed in a first terminal 34a has two widths, one on the side close to a second terminal 36a being large and the other on the side apart from the second terminal 36a being small.

With the configuration described above, since the fixing area between the first terminal 34a of the lead frame terminal 30a and an electronic component can be increased, there is an advantageous effect that the mechanical bonding strength between the support member and the electronic component can be more increased.

MODIFIED EXAMPLE 2

Figure 10B:
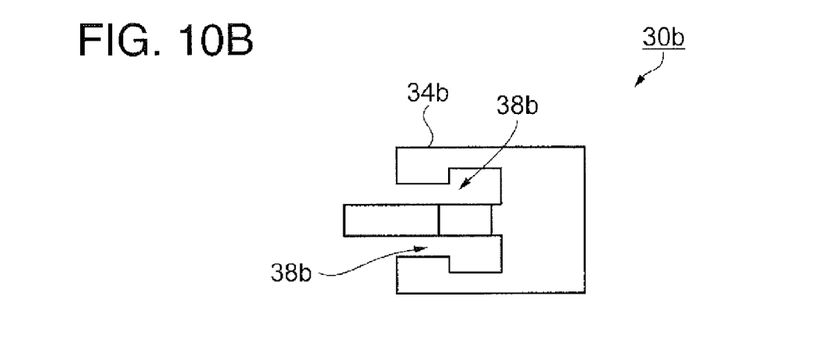

FIG. 10B is a schematic configuration view showing Modified Example 2 of the lead frame terminal used for the electronic device according to the embodiment of the invention.

Hereinafter, a lead frame terminal 30b of Modified Example 2 will be described mainly on the difference from the lead frame terminal 30 of the embodiment described above, and the description of the same matters is omitted.

As shown in FIG. 10B, the lead frame terminal 30b of Modified Example 2 differs from the lead frame terminal 30 of the embodiment in that each notch portion 38b disposed in a first terminal 34b has two widths, one on the side close to a second terminal 36b being small and the other on the side apart from the second terminal 36b being large.

With the configuration described above, since the width of the notch portion 38b around a bent portion of the first terminal 34b is large, there is an advantageous effect that the first terminal 34b is easily bent in a direction apart from the electronic component connected with the first terminal 34b.

MODIFIED EXAMPLE 3

Figure 10C:
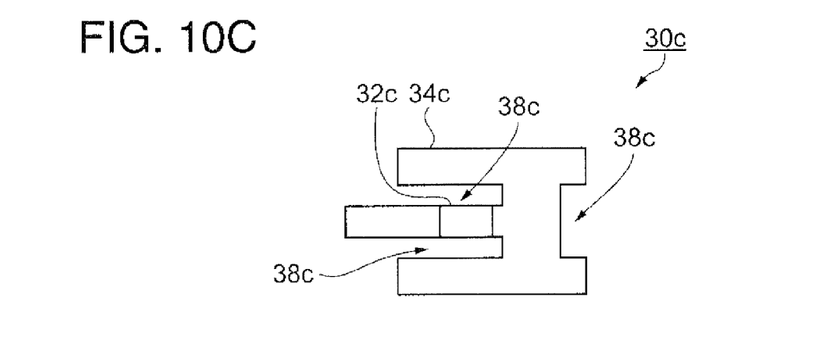

FIG. 10C is a schematic configuration view showing Modified Example 3 of the lead frame terminal used for the electronic device according to the embodiment of the invention.

Hereinafter, a lead frame terminal 30c of Modified Example 3 will be described mainly on the difference from the lead frame terminal 30 of the embodiment described above, and the description of the same matters is omitted.

As shown in FIG. 10C, the lead frame terminal 30c of Modified Example 3 differs from the lead frame terminal 30 of the embodiment in that a notch portion 38c is disposed in a first terminal 34c in a direction opposite to the side where a support portion 32c is coupled.

With the configuration described above, since the area of mounting an electronic component such as a heating element or a thermosensor on an electronic component connected with the lead frame terminal 30c can be increased, more other electronic components can be mounted. Therefore, there is an advantageous effect that the function of the electronic device can be made higher.

MODIFIED EXAMPLE 4

Figure 10D:
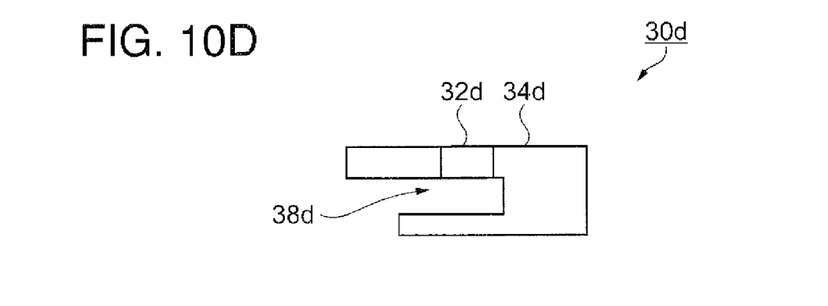

FIG. 10D is a schematic configuration view showing Modified Example 4 of the lead frame terminal used for the electronic device according to the embodiment of the invention.

Hereinafter, a lead frame terminal 30d of Modified Example 4 will be described mainly on the differences from the lead frame terminal 30 of the embodiment described above, and the description of the same matters is omitted.

As shown in FIG. 10D, the lead frame terminal 30d of Modified Example 4 differs from the lead frame terminal 30 of the embodiment in that one notch portion 38d is disposed in a first terminal 34d, and that the notch portion 38d is disposed substantially in the center of the first terminal 34d in a direction intersecting a direction in which the first terminal 34d is coupled with a support portion 32d.

With the configuration described above, since the length of the first terminal 34d in the direction intersecting the direction in which the first terminal 34d is coupled with the support portion 32d is shortened, a number of lead frame terminals 30d can be connected to an electronic component. Therefore, there are advantageous effects that more other electronic components can be mounted and the mechanical bonding strength between a support member and an electronic component can be increased.

Electronic Apparatus

Next, electronic apparatuses to which the electronic device 1 according to the embodiment of the invention is applied will be described in detail based on FIGS. 11 to 13.

Figure 11:
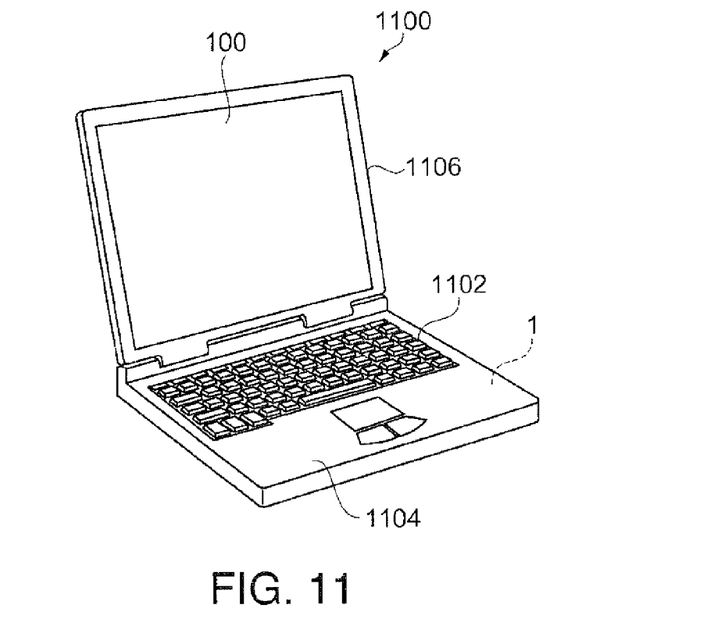
FIG. 11 is a perspective view showing the configuration of a mobile (or notebook) personal computer as an electronic apparatus including the electronic device according to the invention.

FIG. 11 is a perspective view showing the configuration of a mobile (or notebook) personal computer as an electronic apparatus including the electronic device according to the embodiment of the invention. In the drawing, the personal computer 1100 includes a main body portion 1104 including a keyboard 1102 and a display unit 1106 including a display portion 100. The display unit 1106 is rotationally movably supported relative to the main body portion 1104 via a hinge structure portion. In the personal computer 1100, the electronic device 1 is incorporated.

Figure 12:
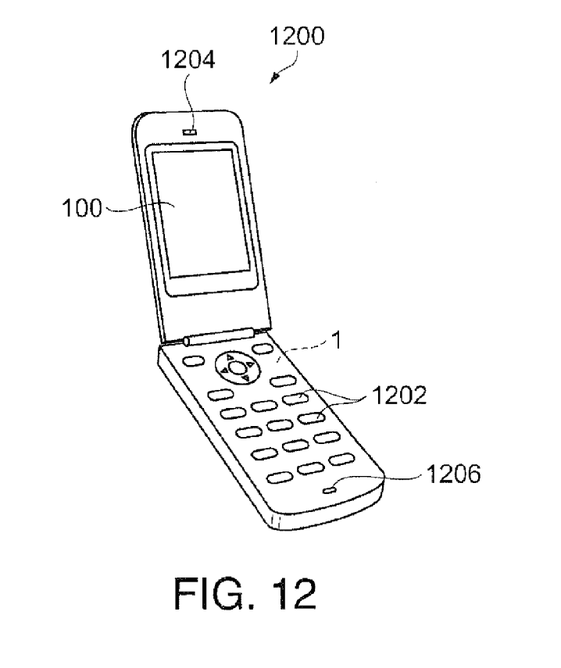
FIG. 12 is a perspective view showing the configuration of a mobile phone (including a PHS) as an electronic apparatus including the electronic device according to the invention.

FIG. 12 is a perspective view showing the configuration of a mobile phone (including a PHS) as an electronic apparatus including the electronic device according to the embodiment of the invention. In the drawing, the mobile phone 1200 includes a plurality of operation buttons 1202, an earpiece 1204, and a mouthpiece 1206. The display portion 100 is arranged between the operation buttons 1202 and the earpiece 1204. In the mobile phone 1200, the electronic device 1 is incorporated.

FIG. 13 is a perspective view showing the configuration of a digital camera as an electronic apparatus including the electronic device according to the embodiment of the invention. In the drawing, connections with external apparatuses are also shown in a simplified manner. Here, usual cameras expose a silver halide photographic film with an optical image of a subject, whereas the digital camera 1300 photoelectrically converts an optical image of a subject with an imaging element such as a charge coupled device (CCD) to generate imaging signals (image signals).

The display portion 100 is disposed on the back surface of a case (body) 1302 in the digital camera 1300 and configured to perform display based on imaging signals generated by the CCD. The display portion 100 functions as a finder that displays a subject as an electronic image. Moreover, on the front side (the rear side in the drawing) of the case 1302, a light receiving unit 1304 including an optical lens (imaging optical system) and the CCD is disposed.

When a photographer confirms a subject image displayed on the display portion 100 and presses down a shutter button 1306, imaging signals of the CCD at the time are transferred to and stored in a memory 1308. Moreover, in the digital camera 1300, a video signal output terminal 1312 and a data communication input/output terminal 1314 are disposed on the side surface of the case 1302. Then, as shown in the drawing, a television monitor 1430 and a personal computer (PC) 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. In the digital camera 1300, the electronic device 1 is incorporated.

In addition to the personal computer 1100 in FIG. 11, the mobile phone 1200 in FIG. 12, and the digital camera 1300 in FIG. 13, an electronic apparatus including the electronic device 1 according to the embodiment of the invention can be applied to, for example, inkjet ejection apparatuses (for example, inkjet printers), laptop personal computers, television sets, video camcorders, video tape recorders, car navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various kinds of measuring instruments, indicators (for example, indicators used in vehicles, aircraft, and ships), flight simulators, and the like.

Moving Object

Figure 14:
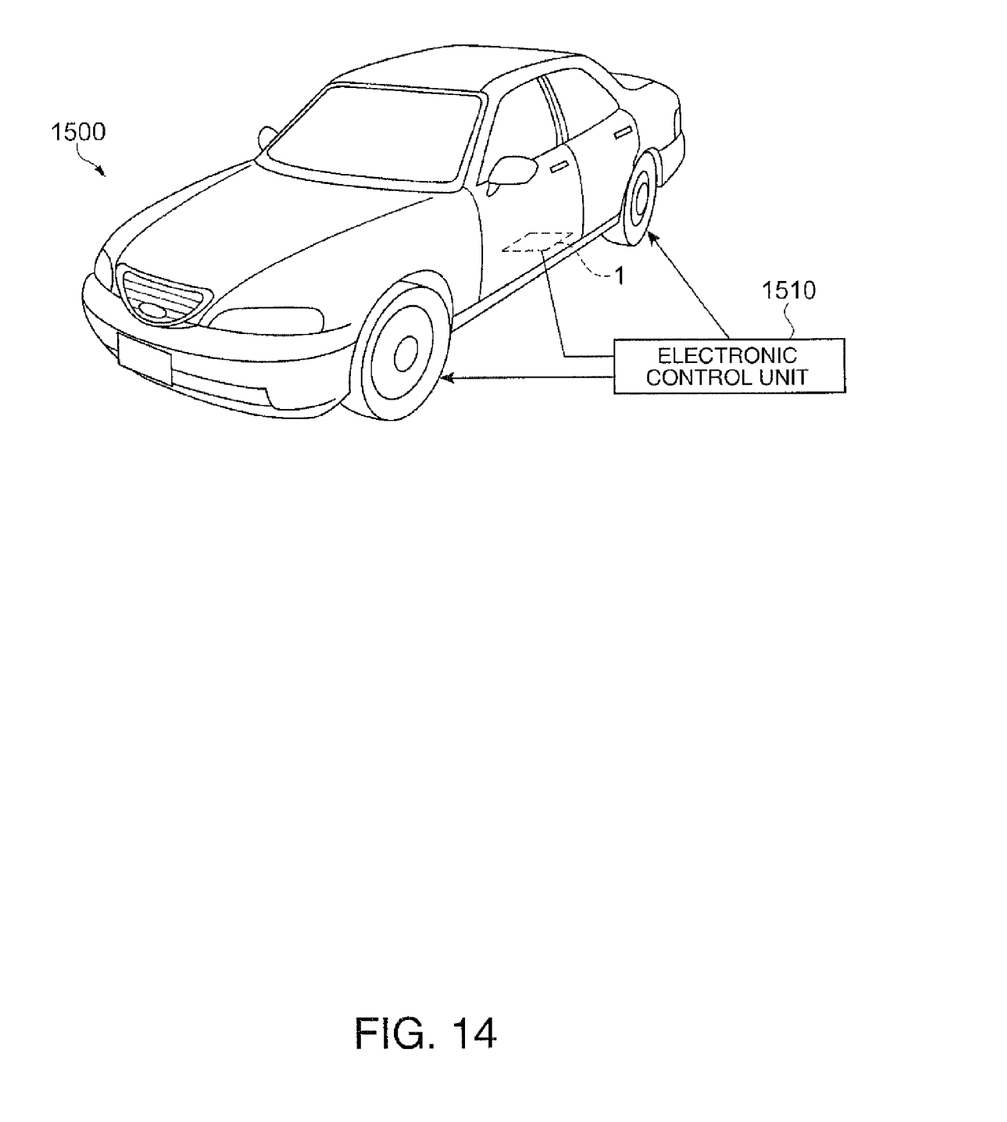
FIG. 14 is a perspective view showing the configuration of an automobile as a moving object including the electronic device according to the invention.

FIG. 14 is a perspective view schematically showing an automobile 1500 as a moving object including the electronic device according to the embodiment of the invention. In the automobile 1500, the electronic device 1 according to the invention is mounted. For example, as shown in FIG. 14, in the automobile 1500 as a moving object, an electronic control unit 1510 that incorporates the electronic device 1 therein and controls tires or the like is mounted in a car body.

In addition, the electronic device 1 can be widely applied to electronic control units (ECUs) such as of keyless entry systems, immobilizers, car navigation systems, car air-conditioners, anti-lock brake systems (ABSs), air bags, tire pressure monitoring systems (TPMSs), engine control, battery monitors for hybrid automobiles and electric automobiles, and car body attitude control systems.

The embodiments of the electronic device, the electronic apparatus, and the moving object of the invention have been described so far based on the drawings. However, the invention is not limited to the embodiments, and the configuration of each portion can be replaced with any configuration having a similar function. Any another configuration may be added to the invention. The embodiments may be combined with each other.

The entire disclosure of Japanese Patent Application No. 2013-71611, filed Mar. 29, 2013 is expressly incorporated by reference herein.

What is claimed is:

1. An electronic device comprising:
a support member including a first terminal, a second terminal, and a support portion extending from the first terminal and coupling the first terminal with the second terminal;
an electronic component; and
a bonding member connecting the first terminal with the electronic component, wherein
in a plan view along a direction in which the first terminal and the electronic component overlap each other, a portion of the first terminal is adjacent to the support portion with a notch portion therebetween and protrudes toward the extending direction side of the support portion,
the support portion is bent at a portion adjacent to the protruding portion of the first Terminal, and
the bent portion of the support portion overlaps the electronic component in the plan view.

2. The electronic device according to claim 1, wherein the electronic component includes a third terminal, and the bonding member includes a conductive first bonding member connecting the first terminal with the third terminal and a non-conductive second bonding member connecting, together with the first bonding member, the first terminal with the electronic component.

3. The electronic device according to claim 2, wherein the first terminal includes a first region overlapping the third terminal and a second region located outside the third terminal in the plan view,
the first bonding member connects the first region with the third terminal, and
the second bonding member connects the second region with the electronic component.

4. The electronic device according to claim 3, wherein the second region of the first terminal includes a region located outside the electronic component in the plan view.

5. The electronic device according to claim 1, wherein the first terminal includes a plurality of the notch portions.

6. The electronic device according to claim 1, further comprising a board, wherein
the electronic component is supported in a spaced-apart state to the board via the support member.

7. An electronic apparatus comprising the electronic device according to claim 1.

8. A moving object comprising the electronic device according to claim 1.

9. The electronic device according to claim 1, wherein the first terminal includes a plurality of the notch portions that form arms extending from a body portion of the first terminal, wherein the plurality of notch portions define longitudinally extending openings between the arms and the portion of the first terminal that protrudes toward the extending direction side of the support portion.

10. The electronic device according to claim 1, wherein the support portion is bent directly in a direction towards the second terminal.

11. A method for manufacturing an electronic device, the electronic device including
a support member including a first terminal, a second terminal, and a support portion extending from the first terminal and coupling the first terminal with the second terminal,
an electronic component, and
a bonding member connecting the first terminal with the electronic component, wherein
in a plan view along a direction in which the first terminal and the electronic component overlap each other, a portion of the first terminal is adjacent to the support portion with a notch portion therebetween and protrudes toward the extending direction side of the support portion,
the support portion is bent at a portion adjacent to the protruding portion of the first terminal, and
the bent portion of the support portion overlaps the electronic component in the plan view,
the method comprising:
connecting the first terminal with the electronic component by means of a first bonding member and connecting the first terminal with the electronic component by means of a second bonding member; and
bending the support portion at a portion adjacent to the protruding portion of the first terminal along the overlapping direction.

12. The method for manufacturing the electronic device according to claim 11, wherein
the electronic component includes a third terminal, and the first terminal includes a first region overlapping the third terminal and a second region located outside the third terminal in the plan view,
the second bonding member is a member that is cured by heating, and
the method further includes, after putting the second bonding member between the first terminal and the electronic component from a region located outside the second region, heating and curing the second bonding member.

* * * * *